(12) United States Patent  
Vandergrift et al.

(10) Patent No.: US 12,199,422 B2
(45) Date of Patent: Jan. 14, 2025

(54) SYSTEMS AND METHODS FOR OVERCURRENT PROTECTION

(71) Applicant: Hamilton Sundstrand Corporation, Charlotte, NC (US)

(72) Inventors: Adrian E. Vandergrift, Rockton, IL (US); Hemanth Kumar Pennam, Satyavedu (IN)

(73) Assignee: Hamilton Sundstrand Corporation, Charlotte, NC (US)

( * ) Notice: Subject to any disclaimer, the term of this patent is extended or adjusted under 35 U.S.C. 154(b) by 267 days.

(21) Appl. No.: 17/712,056

(22) Filed: Apr. 1, 2022

(65) Prior Publication Data
US 2022/0320853 A1  Oct. 6, 2022

(30) Foreign Application Priority Data

Apr. 2, 2021 (IN) .............................. 202141015790

(51) Int. Cl.
*H02H 7/00* (2006.01)
*H02H 1/00* (2006.01)
*H02H 7/22* (2006.01)

(52) U.S. Cl.
CPC .......... *H02H 7/222* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 4,346,424 A | 8/1982 | Hansen | |
| 5,519,561 A * | 5/1996 | Mrenna | H02H 1/0015 337/16 |
| 7,747,879 B2 | 6/2010 | Tofigh et al. | |
| 8,134,820 B1 | 3/2012 | Riccio et al. | |
| 8,218,281 B2 | 7/2012 | Vandergrift | |
| 8,947,837 B2 | 2/2015 | Novakovic et al. | |
| 10,594,133 B2 | 3/2020 | Eberts et al. | |

FOREIGN PATENT DOCUMENTS

| | | |
|---|---|---|
| EP | 0712193 A1 | 5/1996 |
| EP | 3624339 A1 | 3/2020 |

OTHER PUBLICATIONS

Extended European Search Report dated Dec. 20, 2022, issued during the prosecution of European Patent Application No. EP 22166405.5, 7 pages.

* cited by examiner

*Primary Examiner* — Stephen W Jackson

(57) ABSTRACT

A power distribution circuit includes a power input in electrical communication with a power input line, a switching circuit electrically connected to the power input line, and an overcurrent protection circuit electrically connected to the power input line. The overcurrent protection circuit includes a discrete silicon controlled rectifier (SCR) circuit, and a pulse qualifier configured and adapted to drive the discrete SCR circuit. A method for controlling a power distribution circuit includes detecting an ON status of at least a switching circuit. A semi-conductor control signal line connects the semi-conductor switch and the voltage command circuit. The method includes detecting an overcurrent status of the switching circuit with an overcurrent detection circuit. The method includes clamping voltage on the semi-conductor control signal line to cause the semi-conductor switch to be turned off.

20 Claims, 3 Drawing Sheets

SYSTEMS AND METHODS FOR OVERCURRENT PROTECTION

CROSS-REFERENCE TO RELATED APPLICATIONS

This application claims priority to and the benefit of Indian Application No. 202141015790, filed Apr. 2, 2021, the entire contents of which are herein incorporated by reference in their entirety.

BACKGROUND

1. Field

The present disclosure relates to power distribution systems, and more particularly to overcurrent protection in DC power distribution systems.

2. Description of Related Art

In power distribution systems where DC power is distributed to multiple different loads, it is known to use a set of switches/relays in conjunction with a power system controller to control the power flowing to each load. In order to facilitate operation and power distribution to all of the loads, a control circuit, which is capable of controlling the state of each of the switches/relays in the system, is typically utilized.

A description of a traditional control circuit can be found in U.S. Pat. No. 8,218,281 B2 issued on Jul. 10, 2012, assigned to Hamilton Sundstrand Corporation, herein incorporated by reference in its entirety. In U.S. Pat. No. 8,218,281, a discrete silicon-controlled rectifier (SCR) used for over current (OC) protection on the servo drive high-side switch may fire and latch the circuit off due to transistor leakage current, which may cause a nuisance trip.

The conventional techniques have been considered satisfactory for their intended purpose. However, there is an ever present need for improved systems and methods for over current protection with reduced nuisance trips. This disclosure provides a solution for this need.

SUMMARY

A power distribution circuit includes a power input in electrical communication with a power input line, a switching circuit electrically connected to the power input line, and an overcurrent protection circuit electrically connected to the power input line. The overcurrent protection circuit includes a discrete silicon controlled rectifier (SCR) circuit, and a pulse qualifier configured and adapted to drive the discrete SCR circuit.

In some embodiments, the overcurrent protection circuit includes a comparator circuit. An output of the comparator circuit can be in electrical communication with an input of the pulse qualifier. The pulse qualifier can include a ground return to a floating ground. The pulse qualifier can include an output in electrical communication with the discrete SCR circuit. The pulse qualifier can be configured and adapted to be an edge or level triggered pulse qualifier with a time delay. The pulse qualifier can be electrically connected to the power input line to receive power therefrom.

The switching circuit can include a semi-conductor switch between the power input and a load voltage output. The switching circuit can include a voltage command circuit electrically connected to the semi-conductor switch along a semi-conductor control signal line to provide a command voltage thereto. The power distribution circuit can include a current limit circuit electrically connected to the power input line. The discrete SCR circuit can include a latch voltage output in electrical communication with the semi-conductor control signal line to control and limit current through the semi-conductor switch. The switching circuit can include a voltage clamp circuit electrically connected between the power input and a gate of the semi-conductor switch. The overcurrent protection circuit can include a zener diode connected to the power input.

In accordance with another aspect, a method for controlling a power distribution circuit includes detecting an ON status of at least a switching circuit, the switching circuit including a semi-conductor switch and a voltage command circuit. A semi-conductor control signal line connects the semi-conductor switch and the voltage command circuit. The method includes detecting an overcurrent status of the switching circuit with an overcurrent detection circuit. The overcurrent detection circuit comprising a discrete silicon controlled rectifier (SCR) circuit, and a pulse qualifier configured and adapted to drive the discrete SCR circuit. The method includes clamping voltage on the semi-conductor control signal line to cause the semi-conductor switch to be turned off.

Detecting the overcurrent status can include detecting a current flowing through a shunt resistor on a power input line with a comparator that monitors the voltage developed across the shunt resistor. Detecting the overcurrent status can include detecting the overcurrent status when a current on a power input line exceeds a preset threshold.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION

Figure 1:
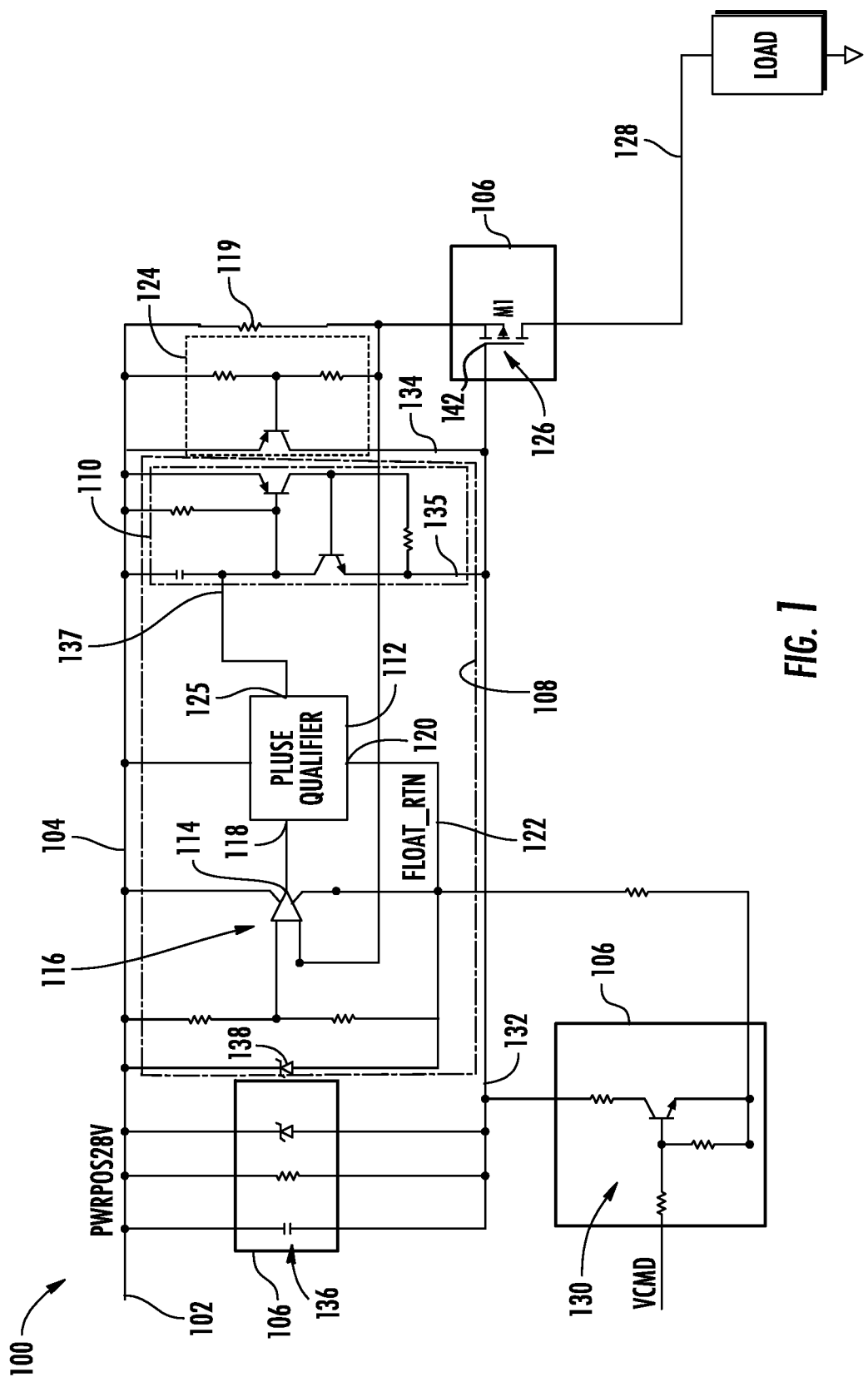
FIG. 1 is a schematic diagram of an embodiment of a power distribution circuit constructed in accordance with the present disclosure, showing a generalized depiction of the power distribution circuit.

Reference will now be made to the drawings wherein like reference numerals identify similar structural features or aspects of the subject disclosure. For purposes of explanation and illustration, and not limitation, a partial view of an embodiment of a system in accordance with the disclosure is shown in FIG. 1 and is designated generally by reference character 100. Other embodiments of systems in accordance with the disclosure, or aspects thereof, are provided in FIGS.

2-3, as will be described. The systems and methods described herein provide a power distribution circuit with improved performance including more precise trip delay, ease of configurability per given trip current versus trip delay requirements, ease of circuitry layout having only a single supply reference. The existing method will have wider tolerance range of trip time delay due to wide tolerance range of the RC (Resistor*Capacitor) time constant, which is used for the overcurrent trip timing.

Figure 2:
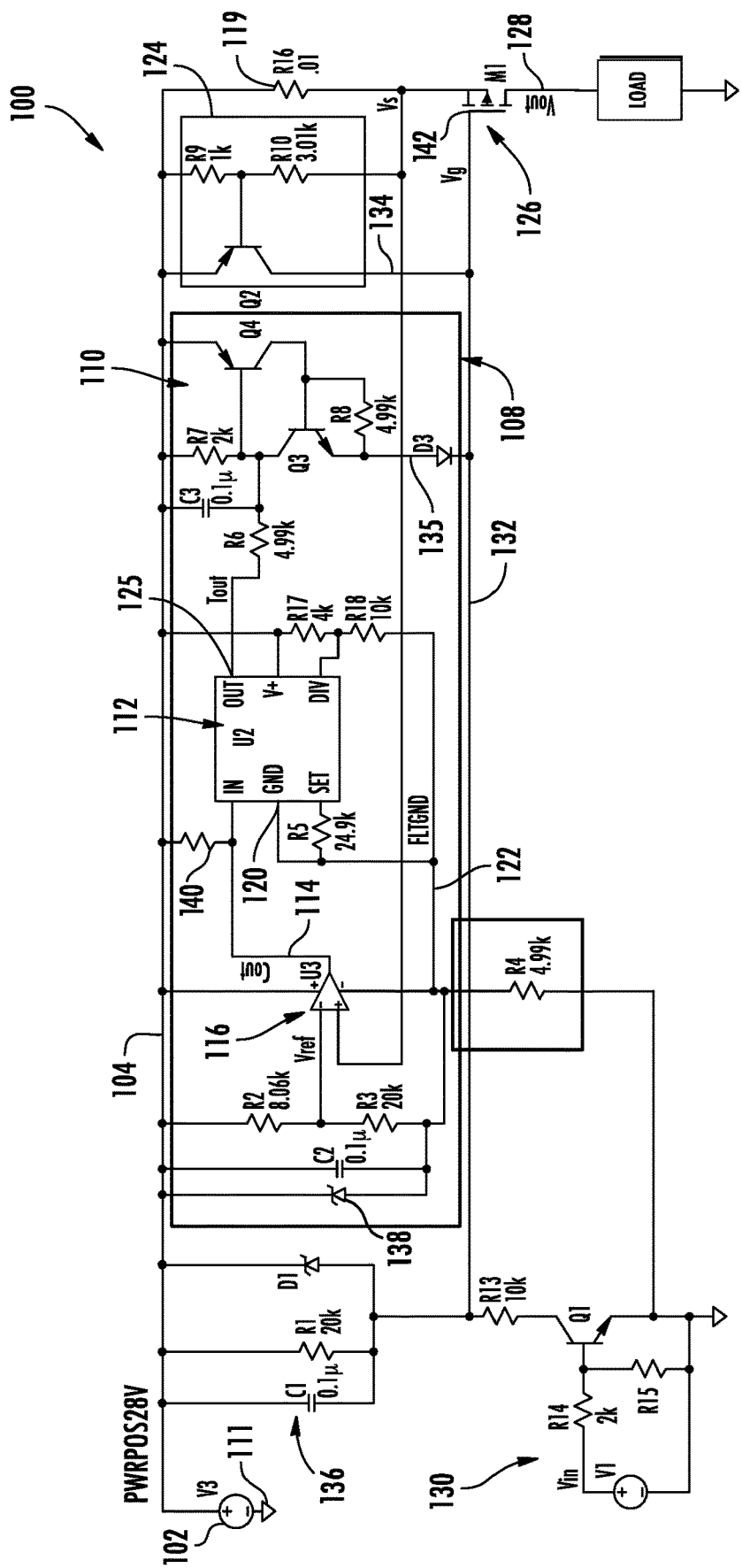
FIG. 2 is a schematic diagram of the power distribution circuit of FIG. 1, showing a more detailed depiction of the power distribution circuit and its overcurrent protection circuit.

As shown in FIGS. 1-2, a power distribution circuit 100 includes a power input 102 in electrical communication with a power input line 104 and a return line 111. The power distribution circuit 100 is driven by "PWRPOS28V" which is internally generated DC voltage from an AC input through a conversion unit (AC-DC conversion circuit) or from an aircraft battery supply. The typical operating voltage range of the "PWRPOS28V" is 18V to 32.2 Vdc. A switching circuit 106 is electrically connected to the power input line 104. A shunt resistor 119 is electrically connected in series between the switching circuit 106 and power input 102. An overcurrent protection circuit 108 is electrically connected to the power input line 104. The overcurrent protection circuit 108 includes a discrete silicon controlled rectifier (SCR) circuit 110, and a pulse qualifier integrated circuit 112, e.g. LTC6994-1 available from a variety of electronics manufacturers. The overcurrent protection circuit 108 provides protection to switching circuit 106, or portions thereof, during an overcurrent scenario. The pulse qualifier 112 is configured and adapted to drive the discrete SCR circuit 110. The pulse qualifier 112 includes an output 125 in electrical communication with the discrete SCR circuit 110. The pulse qualifier 112 is configured and adapted to be an edge or level triggered pulse qualifier 112 with a time delay. In an "overcurrent detected" scenario, the pulse qualifier 112 is used to configure the desired trip time in an accurate and simple manner.

With continued reference to FIGS. 1 and 2, the pulse qualifier 112, and any other components of power distribution circuit 100, are electrically connected to the power input line 104 to receive power therefrom (PWRPOS28V). The pulse qualifier 112 includes a ground return 120 to a floating ground 122 (FLOATING_RTN or FLTGND) which allows for a simple printed wiring board layout. Due to the pulse qualifier 112, the selection of a base-emitter resistor (Rbe) is easier than traditional power distribution circuits and is independent of type of comparator used and its parameters such as bias current and off set voltages. Using the pulse qualifier 112 to trigger the discrete SCR circuit 110, instead of using the comparator output 118, which is done in the embodiment described in U.S. Pat. No. 8,218,281, allows resistors in the discrete SCR circuit 110 to be lower value reducing the risk of nuisance trips due to leakage current effects. The overcurrent protection circuit 108 includes a comparator circuit 116. Overcurrent protection circuit 108 includes a zener diode 138 used to provide the controlled and regulated supply voltage to comparator circuit 116 and pulse qualifier 112 with reference to floating ground 122. Zener diode 138 takes input from power input 102 only.

An output 114 of the comparator circuit 116 is in electrical communication with an input 118 of the pulse qualifier 112. When an overcurrent condition is detected by the comparator circuit 116, the comparator output 114 changes state and triggers the input of the pulse qualifier 112 to begin timing. If the overcurrent condition stays active, after the pulse qualifier's 112 delay time is reached, the pulse qualifier output 125 changes state and triggers the discrete SCR 110. The discrete SCR circuit 110 can then be ensured to trip only if a valid over current condition occurs and any transient glitches will be ignored.

With continued reference to FIGS. 1 and 2, the switching circuit 106 includes a semi-conductor switch 126 between the power input 102 and a load voltage output 128 (Vout). The switching circuit 106 includes a voltage command circuit 130 electrically connected to the semi-conductor switch 126 along a semi-conductor control signal line 132 to provide a command voltage, e.g. a voltage command (VCMD) signal thereto. The switching circuit 106 includes a voltage clamp circuit 136, which includes C1, R1, and D1, connected in between power input 102 and a gate 142 of semi-conductor switch 126. Voltage clamp circuit 136 and the voltage command circuit 130 are used to control the gate 142 of semi-conductor switch 126 to turn it ON or OFF and to protect the gate of the semi-conductor switch 126 from over voltage conditions. The voltage command circuit 130 senses the VCMD signal to control the contactor drive circuit, e.g. the "LOAD," ON/OFF via switch 126 during non-overcurrent scenarios. The VCMD signal can be (+5V) or (+3.3V) based on a generator control unit (GCU), not shown, internal circuits design. The power distribution circuit 100 includes a current limit circuit 124 electrically connected to the power input line 104. The current limit circuit 124 includes a voltage clamp output 134 in electrical communication with the semi-conductor control signal line 132 to control and limit current through the semi-conductor switch 126. For overcurrent conditions, if switch 106 is ON and the output 114 of the comparator circuit 116 indicates that the current exceeds a preset threshold for the pulse qualifier 124 time delay, the pulse qualifier 124 then outputs an overcurrent detected signal from output 125 to an input 137 of the discrete SCR circuit 110. The SCR circuit 110 then is triggered to provide a clamping voltage on the semi-conductor control signal line 132 with a latch voltage 135, to cause the semi-conductor switch 106 to be turned OFF. A resistor 140 is positioned between the output 114 of the comparator circuit 116 and the power input line 104. Resistor 140 is used to pull up the comparator output when the output 114 is in the open collector state.

A method for controlling a power distribution circuit, e.g. power distribution circuit 100, includes detecting an ON status of at least a switching circuit, e.g. the switching circuit 106, the switching circuit including a semi-conductor switch, e.g. semi-conductor switch 126, and a voltage command circuit, e.g. voltage command circuit 130 (VCMD). A semi-conductor control signal line, e.g. semi-conductor control signal line 132, connects the semi-conductor switch and the voltage command circuit. The method includes detecting an overcurrent status of the switching circuit with an overcurrent detection circuit, e.g. an overcurrent detection circuit 108. Detecting the overcurrent status include detecting a current on a power input line, e.g. a power input line 104, with a comparator, e.g. comparator 116, and generating a comparator output based on a comparison between the current on the power input line and a preset threshold.

The overcurrent detection circuit includes a discrete silicon controlled rectifier (SCR) circuit, e.g. discrete SCR circuit 110, and a pulse qualifier, e.g. a pulse qualifier 112, configured and adapted to drive the discrete SCR circuit. The comparator output, e.g. provided at output 114, is provided to the pulse qualifier to ensure to trip only if there is a valid over current condition occurs and any transient glitches will be ignored. When the comparator detects a current that exceeds a preset threshold by monitoring the voltage across a shunt resistor, e.g. shunt resistor 119, the method includes outputting an overcurrent detected signal to the discrete SCR circuit and clamping voltage on the semiconductor control signal line with a latch voltage output, e.g. latch voltage 135, to cause the semi-conductor switch to be turned OFF.

Figure 3:
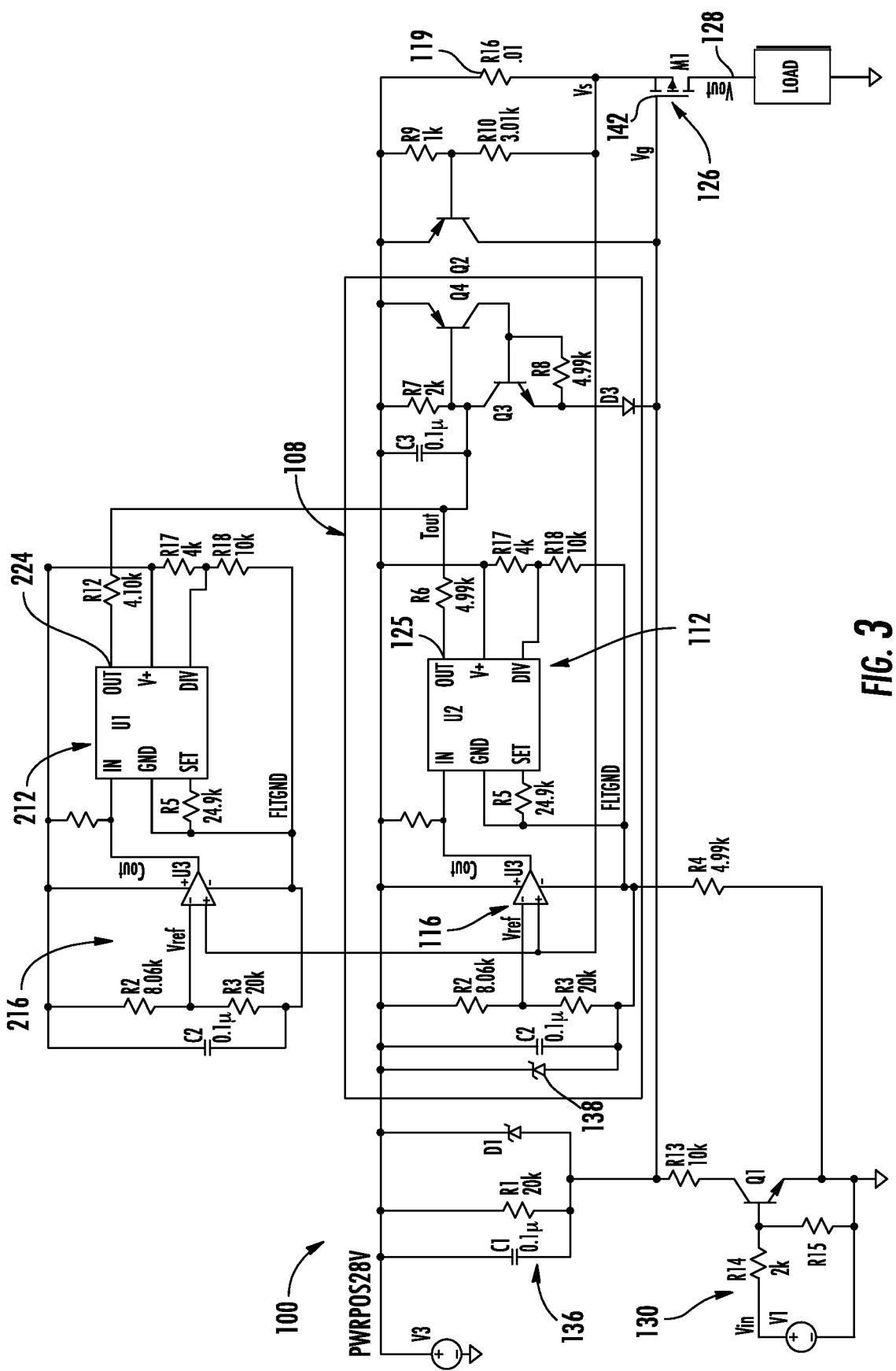
FIG. 3 is a schematic diagram of the power distribution circuit of FIG. 2, showing an additional comparator circuit and pulse qualifier.

As shown in FIG. 3, in accordance with some embodiments, a slow-trip and a fast-trip can be provided to a discrete SCR circuit 110. In the embodiment of FIG. 3, a power distribution circuit 100 is the same as circuit 100 as shown in FIG. 2 except that an additional comparator circuit 216 and pulse qualifier circuit 212 are provided. Comparator 216 and pulse qualifier 212 are the same as comparator circuit 116 and pulse qualifier 112, respectively, except that comparator 216 and pulse qualifier 212 can be configured to provide a slow-trip signal to discrete SCR circuit 110, with comparator circuit 116 and pulse qualifier 112 configured to provide a fast-trip signal to discrete SCR circuit 110.

The proposed systems and methods for overcurrent protection are universal and can be used for a variety of contactor drive circuits, or other loads, across multiple programs. The methods and systems of the present disclosure, as described above and shown in the drawings, provide for reduced nuisance trips, e.g. those due to leakage current from the semiconductor switch, more precise trip delay, ease of configurability per given trip current versus trip delay requirements, and ease of circuitry layout having only a single supply reference. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A power distribution circuit comprising:
   a power input in electrical communication with a power input line;
   a switching circuit electrically connected to the power input line; and
   an overcurrent protection circuit electrically connected to the power input line, the overcurrent protection circuit comprising (i) a discrete silicon controlled rectifier (SCR) circuit and (ii) a level-triggered pulse qualifier configured and adapted to drive the discrete SCR circuit.

2. The power distribution circuit of claim 1, wherein the overcurrent protection circuit further includes a comparator circuit, wherein an output of the comparator circuit is in electrical communication with an input of the level-triggered pulse qualifier.

3. The power distribution circuit of claim 1, wherein the level-triggered pulse qualifier includes a ground return to a floating ground.

4. The power distribution circuit of claim 1, wherein the level-triggered pulse qualifier includes an output in electrical communication with the discrete SCR circuit.

5. The power distribution circuit of claim 1, wherein the level-triggered pulse qualifier is configured and adapted to operate with a time delay.

6. The power distribution circuit of claim 1, wherein the level-triggered pulse qualifier is electrically connected to the power input line to receive power therefrom.

7. The power distribution circuit of claim 1, wherein the switching circuit includes a semiconductor switch between the power input and a load voltage output.

8. The power distribution circuit of claim 7, wherein the switching circuit further includes a voltage command circuit electrically connected to the semiconductor switch along a semiconductor control signal line to provide a command voltage thereto.

9. The power distribution circuit of claim 8, wherein the discrete SCR circuit includes a latch voltage output in electrical communication with the semiconductor control signal line to control and limit current through the semiconductor switch.

10. The power distribution circuit of claim 7, wherein the switching circuit includes a voltage clamp circuit electrically connected between the power input and a gate of the semiconductor switch.

11. The power distribution circuit of claim 1, further comprising a current limit circuit electrically connected to the power input line.

12. The power distribution circuit of claim 1, wherein the overcurrent protection circuit includes a zener diode connected to the power input.

13. A method for controlling a power distribution circuit, the method comprising:
    detecting an ON status of at least a switching circuit, the switching circuit including a semiconductor switch and a voltage command circuit, wherein a semiconductor control signal line connects the semiconductor switch and the voltage command circuit;
    detecting an overcurrent status of the switching circuit with an overcurrent detection circuit, the overcurrent detection circuit comprising (i) a discrete silicon controlled rectifier (SCR) circuit and (ii) a level-triggered pulse qualifier configured and adapted to drive the discrete SCR circuit; and
    clamping voltage on the semiconductor control signal line to cause the semiconductor switch to be turned off.

14. The method as recited in claim 13, wherein detecting the overcurrent status includes detecting a current flowing through a shunt resistor on a power input line with a comparator that monitors voltage developed across the shunt resistor.

15. The method as recited in claim 13, wherein detecting the overcurrent status includes detecting the overcurrent status when a current on a power input line exceeds a preset threshold.

16. The method as recited in claim 13, wherein the level-triggered pulse qualifier operates with a time delay.

17. The method as recited in claim 13, wherein the level-triggered pulse qualifier includes a ground return to a floating ground.

18. The method as recited in claim 13, wherein the discrete SCR circuit includes a latch voltage output in electrical communication with the semiconductor control signal line to control and limit current through the semiconductor switch.

19. The power distribution circuit of claim 2, wherein the overcurrent protection circuit further includes a shunt resistor coupled to the power input line, the comparator circuit configured to monitor a voltage across the shunt resistor.

20. The power distribution circuit of claim 1, wherein the overcurrent protection circuit is configured to detect an overcurrent status when a current on the power input line exceeds a preset threshold.

* * * * *